Figure 1:
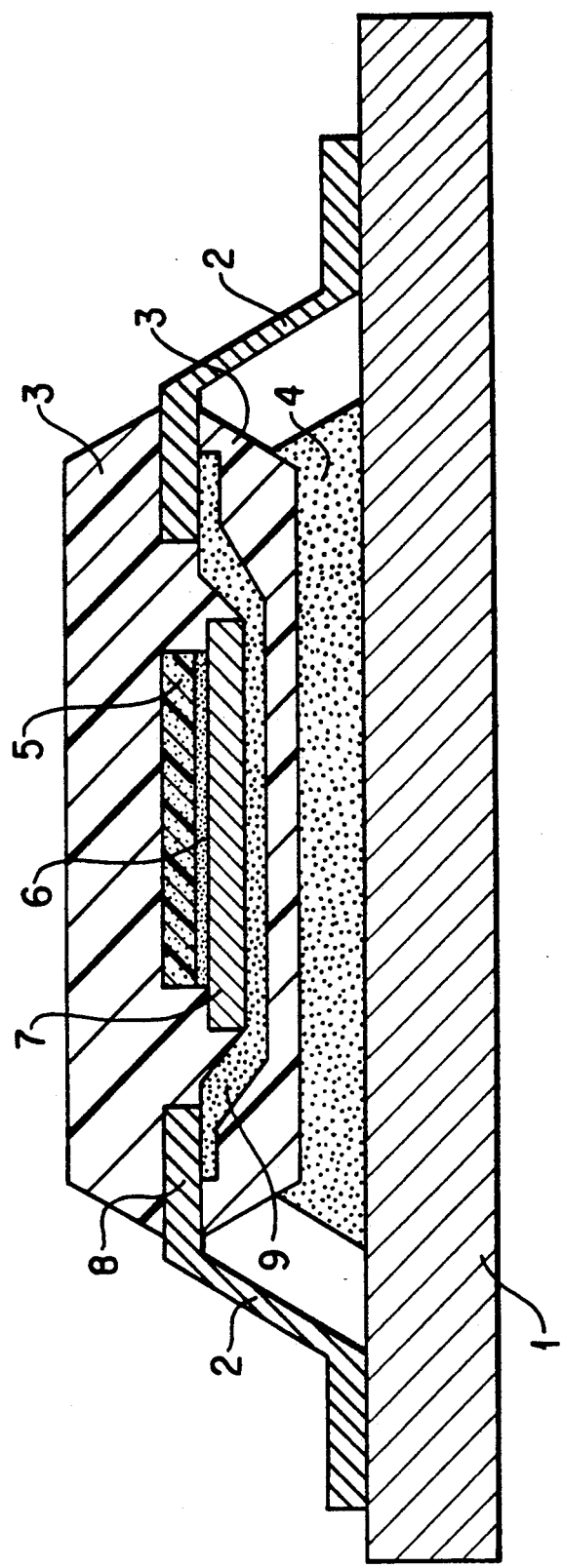

United States Patent [19]

Bujard

[11] Patent Number: 5,290,624

[45] Date of Patent: Mar. 1, 1994

[54] HEAT-CONDUCTIVE ADHESIVE FILMS, LAMINATES WITH HEAT-CONDUCTIVE ADHESIVE LAYERS AND THE USE THEREOF

[75] Inventor: Patrice Bujard, Courtepin, Switzerland

[73] Assignee: Ciba-Geigy Corporation, Ardsley, N.Y.

[21] Appl. No.: 872,745

[22] Filed: Apr. 22, 1992

[30] Foreign Application Priority Data

Apr. 24, 1991 [CH] Switzerland .................. 1226/91
Jul. 10, 1991 [CH] Switzerland .................. 2056/91

[51] Int. Cl.⁵ ............................................. B32B 9/00
[52] U.S. Cl. ................................. 428/209; 428/308.4; 428/368; 428/384; 428/901; 174/250; 174/255; 174/256; 174/258; 174/259
[58] Field of Search ............... 428/901, 308.4, 368, 428/209, 384; 174/250, 255, 256, 258, 259

[56] References Cited

U.S. PATENT DOCUMENTS

| | | | |
|---|---|---|---|
| 3,399,268 | 8/1968 | Schneble, Jr. et al. | 174/259 |
| 4,207,369 | 6/1980 | Kazmierowicz | 428/901 |
| 4,818,626 | 4/1989 | Werdecker et al. | 428/901 |
| 4,977,012 | 12/1990 | Ishikawa | 428/209 |
| 5,061,549 | 10/1991 | Shores | 428/209 |

FOREIGN PATENT DOCUMENTS 257466 3/1988 European Pat. Off. .
309982 4/1989 European Pat. Off. .
2597261 10/1987 France .
2060435 5/1981 United Kingdom .

OTHER PUBLICATIONS

Chem. Abst. 87-343851/49 for FR 2597261.
Chem Abst. JP 59,175,753.
Chem Abst. JP 2,082,559.
Andrews et al IEEE Transactions on Components, Hybrids and Manufacturing Technology, vol. CHM T-4, pp. 455-461 (1981).
McPherson et al. International Reliability Physical Symposium pp. 224-228 (1987).
Leung et al. Hybrid Circuits, No. 18, pp. 22-24 (1989).

Primary Examiner—Patrick J. Ryan
Assistant Examiner—Cathy K. Lee
Attorney, Agent, or Firm—Kevin T. Mansfield; George R. Dohmann

[57] ABSTRACT

A laminate comprising (a) a carrier having a heat conductivity of at least 10 W/mK and a thickness of 10 to 100 μm, and (b) a dielectric adhesive layer which is applied to at least one surface of said substrate and which contains a heat-conductive filler and has a thickness of 5 to 500 μm and a heat conductivity of 1 W/mK. The flexible laminate, or a dielectric and self-supporting adhesive film which contains a heat-conductive filler and has a heat conductivity of at least 1 W/mK, is suitable for removing heat from leadframes which have electrically insulated contact surfaces for electrical and electronic components and which are encapsulated with a synthetic resin moulding material, typically dual-in-line plastic packages, by bonding the rear sides of the contact surfaces to the leads.

16 Claims, 2 Drawing Sheets

HEAT-CONDUCTIVE ADHESIVE FILMS, LAMINATES WITH HEAT-CONDUCTIVE ADHESIVE LAYERS AND THE USE THEREOF

The present invention relates to a laminate comprising (a) a heat-conductive substrate, and (b) a dielectric adhesive layer which is applied to at least one surface of said substrate and which contains a heat-conductive filler, to the use of said laminate or of a dielectric adhesive film which contains a heat-conductive filler for removing heat from electrical and electronic components, and to leadframes which contain said laminate or said adhesive film as thermal bridge for heat dissipation, as well as to a dual-in-line plastic package (DIP) with said leadframes.

The thermal resistance of plastic-encapsulated electronic components is an important factor for their efficient functioning. The thermal resistance, expressed as $\Theta_{JA}$ and measured in K/W, expresses the temperature difference between the component and the environment which is produced by a heat output of 1 watt. The maximum permissible thermal resistance is expressed by the loss in energy of the component, the temperature of the environment and the maximum temperature which the component will tolerate. The required specification can be met to a certain degree by the choice of material as well as construction.

The increasing miniaturisation of electronic components requires effective conduction of the heat generated during operation. The proposal has already been made to dissipate the heat with an inflexible metal plate as heat spreader which is mounted, electrically insulated, below the leadframe. The materials used for the heat spreader are metals and alloys [q.v. J. A. Andrews et al., IEEE Transactions on Components, Hybrids and Manufacturing Technology, Vol. CHMT-4, No. 4, pages 455–461 (1981)] or ceramic materials, for example SiC [q.v. J. W. McPherson et al., International Reliability Physical Symposium, pages 224–228 (1987)]. The thermal resistance can be reduced by up to 50% by this means. The thermal expansions of leadframes, heat spreader and synthetic resin moulding materials differ so greatly, however, that the thermomechanical stress to which such components are subjected can limit their efficiency and life.

It has now been found that, by means of a flexible laminate comprising a heat-conductive substrate and an adhesive layer or a heat-conductive self-supporting adhesive film, it is possible to achieve an excellent heat dissipation via a leadframe and to reduce substantially damage resulting from thermomechanical stress by bonding the electrically insulated part of a metallic leadframe and its leads to said laminate or to said adhesive film. The heat conduction is so great that encapsulating resins with high loadings of filler can be dispensed with and resins without, or containing only a minor amount of, filler can be used in their stead, whereby damage resulting from thermomechanical stress can be further reduced.

In one of its aspects, the invention relates to a laminate comprising (a) a substrate having a heat conductivity of at least 10 W/mK and a thickness of 10 to 100 $\mu$m, and (b) a dielectric adhesive layer which is applied to at least one surface of said substrate and which contains a heat-conductive filler and has a thickness of 5 to 500 $\mu$m and a heat conductivity of at least 1 W/mK.

The substrate may conveniently be a film, foil or cloth of metal, alloy or synthetic resin moulding material having high heat conductivity and a melting point higher than about 150° C., or a cloth of carbon or ceramic fibres. Metals and alloys are preferred the surfaces of which can be oxidised to achieve good electrical insulation. Preferred metals and alloys are copper, nickel, zinc, aluminium and alloys of copper and nickel. Most preferably the substrate consists of aluminium or copper which may be oxidised on the surface.

The heat conductivity of the substrate is preferably at least 20 W/mK and the thickness is preferably 10 to 70 $\mu$m and, most preferably, 20 to 60 $\mu$m.

The thickness of the adhesive layer is preferably 20 to 300 $\mu$m and, most preferably, 50 to 250 $\mu$m. The heat conductivity of the adhesive layer is preferably at least 1.5 W/mK and may be up to c. 5 W/mK.

A host of adhesives are known and familiar to those skilled in the art. They may be pasty, viscous or solid adhesives, and the adhesive layer may be provided with a protective film which is removed before processing. It is also possible to apply liquid or molten adhesives to the substrate before processing. Further, film adhesives and hot melt adhesives can also be used. Suitable adhesives are typically those based on epoxy resins, polyurethanes, polyacrylates, silicones and thermoplastics, for example polyamides and polyesters.

Preferred adhesives are epoxy resins, especially those based on diglycidyl ethers or advanced diglycidyl ethers of bisphenol A which contain a latent hardener and possibly a curing accelerator. Epoxy film adhesives are described, inter alia, by L. M. Leung in Hybrid Circuits, No. 18, pages 22–24 (1989).

The filler can be finely particulate, in which case it will normally have a particle size not larger, and preferably smaller, than the thickness of the adhesive layer. It is convenient to use systems with a high loading of filler of achieve a high heat conductivity. The loading of finely particulate filler may be typically 25 to 90% by weight, preferably 30 to 80% by weight. The loading will depend essentially on the heat conductivity of the finely particulate fillers. The filler can also be in platelet, needle or fibrous form. Such fillers usually result in a higher heat conductivity of the adhesive layers, so that smaller loadings of filler can be used, typically 5 to 40% by weight. The loadings are based on the weight of the adhesive layer. The fillers are not electrical conductors, i.e. they are preferably dielectric.

Suitable and often used heat-conductive and dielectric fillers are typically natural or synthetic minerals and ceramic materials, including diamond, rutile, quartz, talcum, silicates, diatomaceous earths, wollastonite, zirconium, aluminium nitride, alumina, boronitride, zinc oxide, silicon nitride and silicon carbide, as well as mixtures of these fillers. In a preferred embodiment of the invention the filler is aluminium nitride.

The filled adhesives can be prepared by mixing procedures well known in the art and the laminates can be prepared by known coating methods (brushing, doctor coating, curtain coating, spin coating or moulding).

The novel laminates may be planar or preferably shaped such that they are adapted to convex or concave areas of a component (typically a leadframe) with which they are bonded.

The novel laminates are excellently suited to forming a thermal bridge by bonding the leads of a leadframe to its electrically insulated areas. A surprisingly high heat removal is thereby achieved in electrical and electronic encapsulated components. The thermal resistance $\Theta_{JA}$ can be up to three times lower than that of conventional components without or with air cooling. Even bonding to the tips of the leads will suffice for an effective heat removal. By adapting the shape of the laminate and by the choice of materials it is possible substantially to prevent thermomechanical stresses, taking into account the thermal coefficients of expansion, and to ensure a long life of encapsulated electronic components such as dual-in-line plastic packages.

In a particularly advantageous embodiment of the invention, dielectric and self-supporting adhesive films which contain a heat conductive filler can be used to form a thermal bridge. The same preferences respecting the adhesive films and fillers apply as previously stated in respect of the adhesive films of the novel laminates. The adhesive films can also be planar or preferably shaped such that they are adapted to convex and/or concave areas of a component, typically a leadframe. The heat removal of the adhesive films is suprisingly in the range of the values which are found for the novel laminates. A particular advantage over the novel laminate is that the omission of the metal substrate can, on the one hand, reduce thermomechanical stresses and, on the other, make it possible to achieve very good adhesion between the bonding materials, especially if the resin adhesives and other synthetic resin moulding materials, for example encapsulating resins for a leadframe, are made of the same basic material, for example epoxy resins. Further, the fabrication of leadframes and dual-in-line plastic packages is simplified and more economical.

The adhesive films have a heat conductivity of at least 1 W/mK and preferably a thickness of 5 to 500 μm.

In another of its aspects, the invention relates to a leadframe with leads and electrically insulated contact surfaces for electrical and electronic components, the leads and reverse sides of the contact surfaces of which leadframe are bonded to a novel laminate or to a dielectrical and self-adhesive film which contains a heat conductive filler and has a heat conductivity of at least 1 W/mK.

The leadframe can on one side be bonded in its entirety to the laminate or adhesive film. The leads made of metals or alloys, typically copper, aluminium or copper/nickel alloys, are good heat conductors, so that a partial bonding will suffice. In a preferred embodiment of the invention, only the tips of the leads which are contiguous to the contact surface are bonded to the laminate or adhesive film.

The novel leadframes can be fabricated by known methods by bonding to the laminate or to the adhesive film, with or without the application of heat and/or pressure.

In another of its aspects, the invention relates to the use of the leadframe bonded to the laminate or the adhesive film for the fabrication of electrical and electronic components, especially DIPs. The fabrication of such components is known. For example, the procedure may comprise fixing an electrical or electronic component, typically a semiconductor, on the contact surface with or without an adhesive, contacting said component with the electrical leads, followed by encapsulation with a synthetic resin moulding material. Synthetic resin moulding materials for encapsulating electrical and electronic components are commonly known. Epoxy resins are frequently used for this utility.

In yet another of its aspects, the invention relates to a process for removing heat from the area of the electrically insulated contact surfaces for electrical and electronic components of leadframes which are encapsulated with a synthetic resin moulding material, preferably dual-in-line plastic packages, which process comprises bonding the rear sides of the contact surfaces and the dielectric leads of the leadframe to a laminate of this invention or to a dielectric and self-supporting adhesive film which contains a heat conductive filler and which has a heat conductivity of at least 1 W/mK, as heat dissipating layer.

The novel leadframes are especially suitable for the fabrication of DIPs from which an effective heat dissipation is desired during operation. In yet another of its aspects, the invention relates to DIPs which contain a leadframe in which the rear sides of electrically insulated contact surfaces for semiconductor components and electrical leads are bonded to a laminate of this invention or to a dielectric and self-supporting adhesive film which contains a heat-conductive filler and which has a heat conductivity of at least 1 W/mK. Preferably only the tips of the leads are bonded to the laminate or adhesive film. In a preferred embodiment of the dual-in-line plastic package of this invention, the shape of the laminate or adhesive film is such that said laminate or said adhesive film is adapted to convex and concave areas of the leadframe. This design virtually rules out cracking caused by thermomechanical tensile stress.

The preferences cited in respect of the laminate also apply to the other objects of the invention.

FIG. 1 illustrates the cross-section of a novel dual-in-line pastic package (DIP) with an encapsulated chip. A leadframe (2) is applied to a substrate (1), which leadframe consists of the metal leads (8) and the contact surface (7). The encapsulating resin (3) is bonded via a thermally conductive paste (4) to the substrate (1). The chip (5) is fixed by the adhesive layer (6) on the contact surface (7) of the leadframe(2). The contact surface (7) is bonded to the metal leads (8) of the leadframe(2) by the laminate (9) or a dielectric and self-supporting adhesive film(9) which contains a heat-conductive filler.

Figure 2:
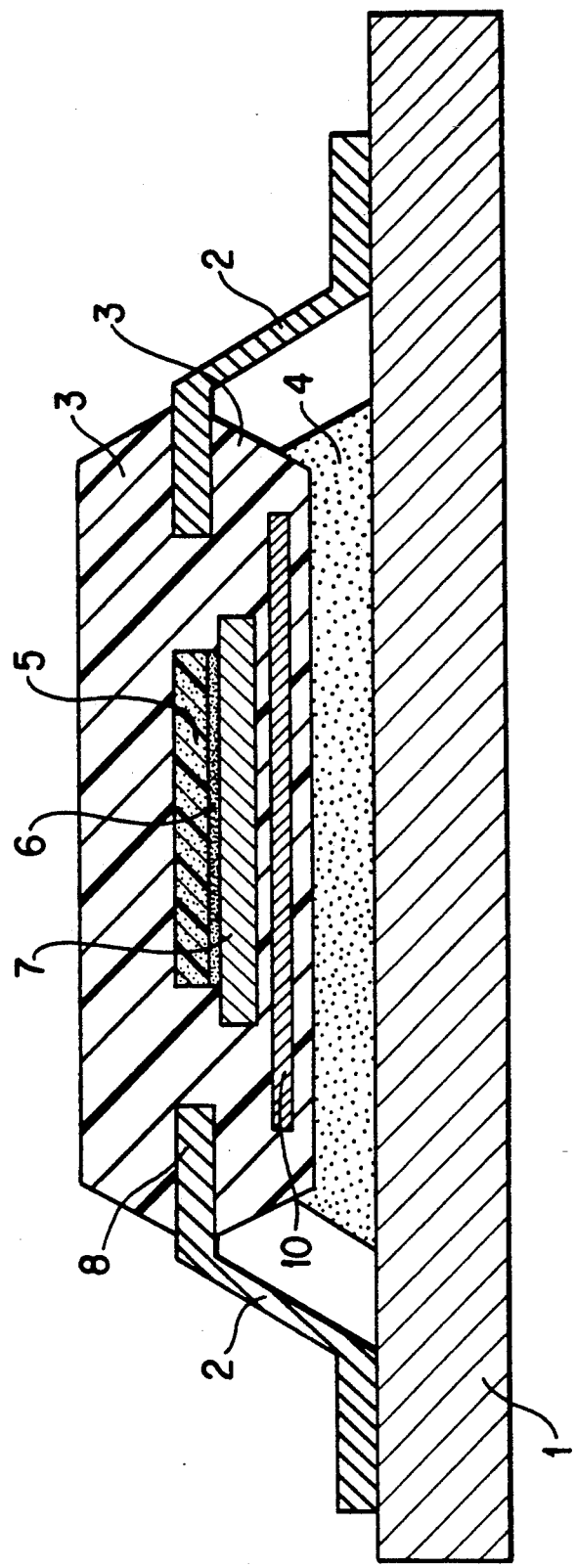

FIG. 2 illustrates a corresponding DIP in which, in place of the laminate (9), a metal plate (10) is embedded below the contact surface (7) in the encapsulating resin (3).

The following Examples illustrate the invention in more detail.

EXAMPLE 1

Preparation of a laminate 67.2% by weight of aluminium nitride with an average particle diameter of 30 μm and a maximum diameter of 100 μm are compounded into a formulation comprising 14.92% by weight of an advanced epoxy resin [preadduct of 66.4% by weight of a diglycidyl ether of bisphenol A, 30.5% by weight of bisphenol A and 3.1% of para-tert-butylphenol (Araldit ® 7097), of which 73.73% are reacted with 19.82% by weight of carboxyl-terminated polybutadiene/acrylonitrile copolymer (Hycar ® CTBN 1300X13) and 6.45% by weight of bisphenol A], 4.4% by weight of diglycidyl ether of bisphenol A, 0.28% by weight of polyether-polyamide block copolymer (Pebax ® 2533, Atochem), 9.33% by weight of elastomer-modified epoxy resin [reaction product of 34.89% by weight of Araldit ® 7097, 16.79% by weight of Hycar ® CTBN 1300X13, 34.76% by weight of solid bisphenol A epoxy resin, (Araldit ® B) and 0.56% by weight of bisphenol A, epoxide equivalent weight 1.1 equivalents/kg], 0.47% by weight of Araldit ® 7097, 1% by weight of cashew nut shell oil (CNSL oil), 0.28% by weight of Aerosil ®, 0.46% by weight of trimethoxy(glycidyloxypropyl)silane (adehesion promoter) 0.46% by weight of glycidyl ester of tertiary carboxylic acid Versatic ® 10 (Cardura ® E 10), 0.92% by weight of dicyandiamide, 0.06% by weight of chlortoluron and 0.22% by weight of Mannich base consisting of poly-p-vinylphenol, dimethylamine and formaldehyde (EP 797, Shell). A melt film adhesive is prepared from the resultant soft tacky composition by knife coating and is laminated under pressure to a copper foil having a thickness of 35 μm. The heat conductivity of the adhesive layer of this laminate is 1.5 W/mK and it has a thickness of 240 μm.

EXAMPLE 2

Fabrication of a leadframe with the laminate of Example 1

The laminate of Example 1 is fixed to the rear side of an electrically insulated contact surface of a 16-pin copper leadframe such that the tips of the electrical leads are covered. Bonding is effected by curing at 180° C. for half an hour. Afterwards the laminate is bonded firmly to the leadframe.

EXAMPLE 3

Fabrication of a DIP

A heating element and a thermocouple are bonded to the chip side of the leadframe of Example 2. The leadframe is then encapsulated in a mould with an epoxy resin having a heat conductivity of 0.2 W/mK and consisting of 185 g of a diglycidyl ether of bisphenol A (Araldit ® GY 260) and 29.5 g of trimethylhexamethylenediamine as hardener. The resin is poured into the mould and hardened at a temperature of 180° C. such that the leadframe is completely encapsulated with a 0.2 cm resin layer. The thermal resistance $\Theta_{JA}$ is found to be 21 W/mK.

EXAMPLE 4

Preparation of laminates and a self-supporting adhesive film

The following components are mixed as in Example 1: 43.7% by weight of diglycidyl ether of bisphenol A, 9.7% by weight of epoxy-phenol novolak, 26.1% by weight of epoxy-cresol novolak, 12.3% by weight of hardener comprising 50 parts by weight of diglycidyl ether of bisphenol A and 50 parts by weight of dicyandiamide, 5.2% by weight of accelerator comprising 73 parts by weight of diglycidyl ether of bisphenol A and 27 parts by weight of a mixture of 52.3 parts by weight of 2,4,6-tris(dimethylaminomethyl)phenol and 47.7 parts by weight of poly-4-vinylphenol, and 3% by weight of phenoxy resin (digycidyl ether of poly-bisphenol A).

A portion of the mixture is mixed with AlN (74% by weight with a particle diameter of 40 μm and 26% by weight with a particle diameter of 1 μm) (total composition: 75.4% by weight of AlN and 24.6% by weight of resin).

A further portion is mixed with quartz powder (particle diameter 30 μm) (total composition: 70% by weight of filler and 30% by weight of resin).

Self-supporting adhesive films having a thickness of 200 μm are prepared from these mixtures as in Example 1. Some of the adhesive films are further processed direct and some are laminated according to Example 1 to a copper foil (thickness 35 μm) and to an aluminium foil (thickness 10 μm).

The following adhesive films and laminates are obtained:
adhesive film A (filler AlN).
adhesive film B (filler quartz powder).
laminate C (copper foil with adhesive film A).
laminate D (copper foil with adhesive film B).
laminate E (aluminium foil with adhesive A).

The adhesive films and laminates are bonded to leadframes as in Example 2 and DIPs are fabricated from these leadframes as described in Example 3. The following thermal resistance values $\Theta_{JA}$ are determined:
adhesive film A: 25 K/W
adhesive film B: 37 K/W
laminate C: 20 K/W
laminate D: 22 K/W
laminate E: 25 K/W

What is claimed is:

1. A laminate comprising (a) a substrate having a heat conductivity of at least 10 W/mK and a thickness of 10 to 100 μm, and (b) a dielectric adhesive layer which is applied to at least one surface of said substrate and which contains a heat-conductive, finely particulate filler selected from the group consisting of aluminum nitride, boron nitride, silicon nitride and silicon carbide, said dielectric adhesive layer having a thickness of 5 to 500 μm and a heat conductivity of 1 W/mK.

2. A laminate according to claim 1, wherein the substrate is selected from the group consisting of foils or cloths of metals, alloys or synthetic resin moulding materials of high heat conductivity and having melting points higher than about 150° C., and of cloths of carbon or ceramic fibres.

3. A laminate according to claim 1, wherein the substrate is selected from the group consisting of metals and alloys.

4. A laminate according to claim 3, wherein the substrate is selected from the group consisting of copper, nickel, zinc, aluminium and alloys of copper and nickel.

5. A laminate according to claim 1, wherein the substrate has a heat conductivity of at least 20 W/mK.

6. A laminate according to claim 1, wherein the substrate has a thickness of 10 to 70 μm.

7. A laminate according to claim 1, wherein the adhesive layer is formed from a pasty, viscous or solid adhesive.

8. A laminate according to claim 1, wherein the adhesive layer is formed from a film adhesive or a hot melt adhesive.

9. A laminate according to claim 1, wherein the adhesive layer contains an epoxy resin as adhesive.

10. A laminate according to claim 1, wherein the thickness of the adhesive layer is from 20 to 300 μm.

11. A laminate according to claim 1, wherein the adhesive layer has a heat conductivity of at least 1.5 W/mK.

12. A laminate according to claim 1, wherein the adhesive layer contains a heat-conductive filler which is finely particulate and has a particle size which is not greater than the thickness of the adhesive layer.

13. A laminate according to claim 12, wherein the heat-conductive filler is a natural or synthetic mineral or a ceramic material.

14. A laminate according to claim 12, wherein the heat-conductive filler is aluminium nitride.

15. A laminate according to claim 1, which is adapted to the shape of the component to which it is bonded.

16. A laminate according to claim 12 wherein the heat-conductive filler has a particle size which is smaller than the thickness of the adhesive layer.

* * * * *

UNITED STATES PATENT AND TRADEMARK OFFICE
CERTIFICATE OF CORRECTION

PATENT NO. : 5,290,624
DATED : March 1, 1994
INVENTOR(S) : Bujard

It is certified that error appears in the above-identified patent and that said Letters Patent is hereby corrected as shown below:

Column 6, line 28 should read:

--500 µm and a heat conductivity of at least 1 W/mK.--

Signed and Sealed this

Second Day of August, 1994

Attest:

BRUCE LEHMAN

*Attesting Officer*  *Commissioner of Patents and Trademarks*